United States Patent [19]

Miller et al.

[11] Patent Number: 4,518,112

[45] Date of Patent: May 21, 1985

[54] PROCESS FOR CONTROLLED BRAZE JOINING OF ELECTRONIC PACKAGING ELEMENTS

[75] Inventors: William R. Miller, Wappingers Falls; Chandrika Prasad, Poughkeepsie, both of N.Y.

[73] Assignee: International Business Machines Corporation, Armonk, N.Y.

[21] Appl. No.: 454,920

[22] Filed: Dec. 30, 1982

[51] Int. Cl.³ .............................................. B23K 1/04
[52] U.S. Cl. .................................. 228/124; 228/44.7; 228/198; 228/263.18
[58] Field of Search ................... 228/123, 124, 173 A, 228/180 A, 198, 263.18, 44.1 A

[56] References Cited

U.S. PATENT DOCUMENTS

| | | | |
|---|---|---|---|
| 3,513,535 | 5/1970 | Clarke | 29/473.1 |
| 3,935,986 | 2/1976 | Laffari et al. | 228/115 |
| 4,034,454 | 7/1977 | Galasso et al. | 428/576 |
| 4,268,585 | 5/1981 | Daur | 228/180 R |
| 4,331,286 | 5/1982 | Miyazaki | 228/198 |
| 4,398,659 | 8/1983 | Richter | 228/124 |
| 4,418,857 | 12/1983 | Ainslee | 228/124 |

OTHER PUBLICATIONS

Miller, W. R., *Disc Preform for Braze Joining Pins to Substrates,* IBM Tech. Disc., May 1982.
IBM TDB, vol. 24, No. 4, Sep. 1981, p. 2146.
IBM TDB, vol. 19, No. 3, Aug. 1976, pp. 836, 837.

*Primary Examiner*—Kenneth J. Ramsey
*Attorney, Agent, or Firm*—Wolmar J. Stoffel

[57] ABSTRACT

A method of forming a brazed joint between conformal surfaces by
  providing a Sn gettering metal layer on at least one of the conformal surfaces,
  placing a mass of a low melting Au Sn alloy between the conformal surfaces,
  heating the resultant assembly to a temperature in excess of the melting point of the alloy,
  simultaneously with heating applying a pressure to force the surfaces together to squeeze the major portion of the molten Au-Sn alloy from between the surfaces, and cooling the assembly,
  the bond between the surfaces formed of a relatively thin higher melting Au-Sn alloy resulting when the major portion of the alloy is removed allowing the remaining Sn to combine with the Sn gettering layer to reduce the relative amount of Sn in the alloy.

3 Claims, 9 Drawing Figures

PROCESS FOR CONTROLLED BRAZE JOINING OF ELECTRONIC PACKAGING ELEMENTS

DESCRIPTION

1. Technical Field

This invention relates to a process for braze attachment of electronic package members, and in particular to a bonding means for joining connector pins and/or flange elements to a multilayer ceramic substrate.

An object of this invention is to provide a strong and non-degradable process for braze joining electrical connection elements to a multilayer ceramic substrate.

2. Background Art

The brazing of elements to electronic chip-carrying substrates, such as multilayer ceramic substrates, particularly substrates having large numbers of devices mounted thereon, requires a brazing or soldering material which remains strong at the high temperatures used for rework. In the fabrication of multilayer multi-device packages, it may be necessary to remove and replace defectively joined chips on the substrate. The relatively high cost of the substrate and devices makes reworking the substrate feasible in order to avoid the discarding of substrates which are otherwise good but may have one or more devices defectively joined. The removal and replacement of chips on the substrate normally requires the heating of the substrate and the device to temperatures sufficient to melt the lead-tin solder balls supporting and joining the chips. A standard solution to joining pin and flange elements to multi-chip carrying substrates is to use a gold-tin solder with a melting point subsequent to brazing that is higher than the initial 280° C. melting point.

In semiconductor package application it would be desirable to perform the operations requiring exposure to the highest temperature first, proceeding to the operations requiring lower temperatures, and finally ending with the lowest temperature operation. When this procedure can be followed, there is less chance that the bond requiring the higher temperature will be disturbed since each successive operation is done at a lower temperature and the unit never reaches the preceeding processing temperature. However, this plan is not always feasible since the bonding materials are not available to meet the relatively demanding requirements as to conductivity and corrosion resistance, and the temperature cannot always be precisely controlled.

When semiconductor devices are joined to the substrate by solder bonding with 90–95% lead 10–5% tin, a joining temperature of 350° C. is necessary. As a practical matter the I/O pins and other fixtures such as metallic flanges must be affixed to the substrates prior to joining of the devices. The danger of disturbing the semiconductor bonds is too great to consider doing allied operations such as joining pins. The pins are conventionally joined using a gold-tin alloy which melts at a temperature on the order of 280° C. which is significantly below the melting point of the solder used to join the chips. When pins are bonded to the substrate by conventionally brazing techniques, the braze material, typically gold-tin alloy, is melted. Consequently, the pins may shift position, the fillet material necessary for strength around the head has a tendency to creep upwardly reducing the strength of the joint, and the layer of material between the head and the metallurgy pad on the substrate may becomes thicker and weaker. Thus the possibility exists that pin joint will be seriously degraded. The situation is aggravated when a number of consecutive rework operations are necessary to correct defectively joined semiconductor devices. The final operation, namely that of joining the cap to the substrate is done at a lower temperature with a lower melting solder which presents no problems.

What is needed in the semiconductor packaging industry is a brazing process wherein the pins and associated elements can be joined to the substrate with a suitable metal or metal alloy which results in a joint that withstands the temperature necessary to join devices without the pin bond being degraded by the joining operation, and more importantly the bond will not degrade by repeated reheating operations.

DISCLOSURE OF THE INVENTION

In accordance with the invention a method of forming a brazed joint that is not significantly degraded by repeated heating operations at temperatures above the original brazing operation is presented. The brazed joint is made between two surfaces by providing a tin gettering metal layer on either one or both of the surfaces to be joined, placing a mass of low melting gold-tin alloy between the surfaces, heating to a temperature sufficient to melt the mass of gold-tin alloy, and subsequently applying a pressure to force the surfaces together sufficient to squeeze the major portion of the molten alloy from the joint while maintaining the joint at the temperature sufficient to react the major portion of the remaining tin with the tin gettering layer, and subsequently cooling the resultant brazed joint.

When pressure is applied the volume of the molten gold-tin between the surfaces to be joined is significantly reduced, thereby reducing the amount of tin, which when combined with gold, increases the melting point. As the tin gettering layer removes the major portion of the remaining tin, the melting point of the molten volume is raised and it freezes forming a bond of an alloy with higher melting alloy. This resultant bond will withstand significantly higher heating without melting. This bond will therefore withstand repeated rework operations on the substrate without significantly degrading.

BRIEF DESCRIPTION OF THE DRAWINGS

This invention will be described in detail with reference to the drawings in which.

DESCRIPTION OF THE PREFERRED EMBODIMENT

The bonding process of this invention can be used for any suitable purpose. However, its principal application is believed to be in the semiconductor packaging technology for securing a plurality of pins to a ceramic substrate containing a plurality of solder bonded devices mounted thereon. A large number of devices on a substrate present the necessity of re-work, i.e. replacing solder bonded devices that may be defectively joined, or replacing defective devices after a period of use, which involves reheating the substrate and devices. The removal of a solder bonded device requires that the substrate and device be heated to approximately 350° C. to remove and remount the device. The pins, normally brazed to the substrate, experience the same temperature as the substrate. Pins brazed by conventional techniques may exhibit one or more of the following undesirable effects which are:

(1) relative movement between the pin and the substrate as the bonding material is heated and softened or melted, (2) reaction of the Sn from the brazed joint when Au-Sn brazing material is used on nickel or other metallic surfaces, thus forming Ni-Sn or other intermetallics thus depleting the surfaces of the unreactive nickel or metals which is essential for good adhesion, (3) collapse and distortion of the Au-Sn fillet due to out-diffusion of Sn with its attendant loss of strength and side support of the pins.

Another possible application is the attaching of a rectangular sealing frame to the substrate where the seal between the frame and the substrate is a hermetic seal. Such a structure is illustrated in U.S. Pat. No. 3,993,123. When the substrate is heated the bond between the sealing frame and the substrate may become weakened thereby destroying the seal and potentially the bond between the elements. The problem of bond degradation is particularly serious when the number of rework applications requiring heating mount.

Figure 1:
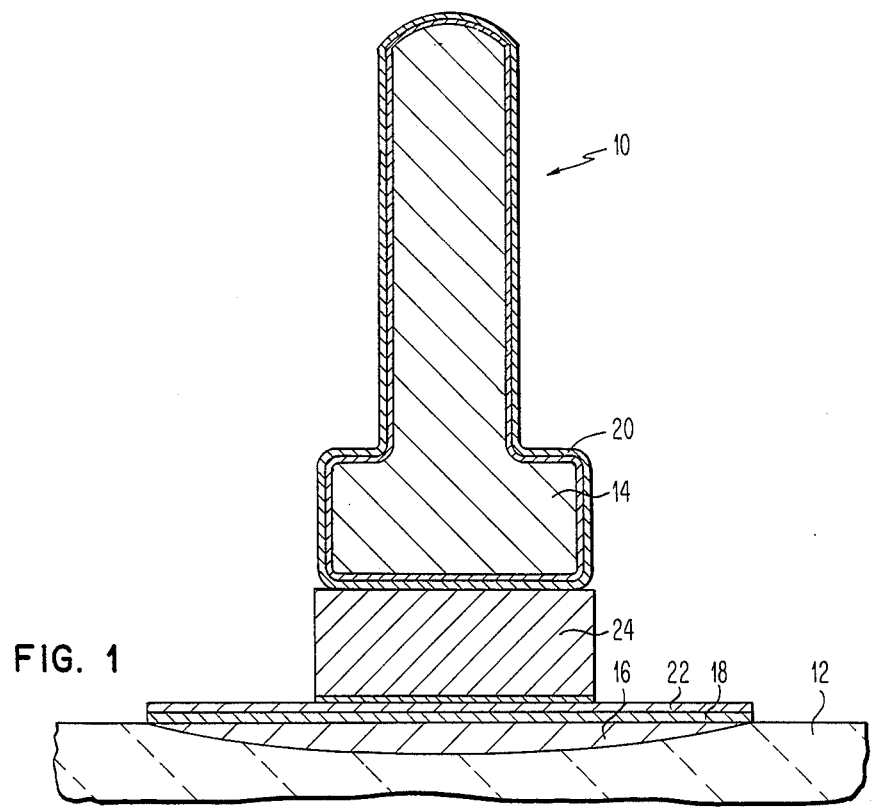
FIG. 1 is a fragment of a multi-layer ceramic substrate carrying a connector pin illustrated at a stage of the bonding process prior to brazing.

Referring to FIG. 1 there is depicted a preferred specific use of the bonding method of our invention. In this specific embodiment a pin 10 is bonded to a ceramic substrate 12. More specifically, the head 14 of pin 12 is bonded to metallized refractory metal pad 16 with an overlying layer 18 of nickel. The substrate 12 is normally a multi-layer ceramic substrate, as described in U.S. Pat. No. 3,245,273 which contains an internal metallurgy system which is in electrical contact with the devices (not shown) mounted on the opposite side and pad 16. Pad 16 is usually a refractory metal pad that was screened on prior to sintering the substrate. The nickel layer 18, provided to improve the bond, is deposited after the substrate had been sintered. Pin 10 is of any suitable metal, such as Kovar, which can have a thin layer of Pd on the surface to increase its contact resistance.

In our method a low melting Au Sn alloy material is selected as the bonding material. This alloy has a composition close to the eutectic mixture of 80 Au 20 Sn, by weight which has a melting point of about 280° C. However, the composition can vary with the gold being $80 \pm 5\%$ by weight and the balance being tin. If desired, small amounts of additive metals can be added to provide specific properties.

A tin gettering layer is deposited on at least one of the surfaces to be bonded. In the preferred method a layer 20 of gold is provided on pin 14 and another layer 22 is provided on the pad 16 over nickel layer 18 on substrate 12. The pad surface and the pin surface to be bonded are both planar and therefore conformal. Other shapes such as convex and concave could be provided if desired.

The Sn gettering layer can be any metal that combines with Sn in solution to form an alloy with a higher melting point. Typical gettering metals include Au, Cu, Ni, Co, Ag, Pd and combinations thereof. The purpose of the gettering layer will become more apparent as the method is explained in detail.

As illustrated in FIG. 1 a preform 24 of Au Sn eutectic placed between the surfaces to be bonded i.e., the pin head 14 and pad 16, and the resultant assembly heated to a temperature in excess of the melting point of the Au-Sn alloy. The heating temperatures can be in the range of 300°–500° C. more preferably in the range of 350°–450° C. Simultaneously as the assembly is heated pressure is applied to force the surfaces being bonded together. The force can be any suitable magnitude sufficient to squeeze the molten Au-Sn alloy of the melted preform 24 outwardly to form a fillet around the pin bond 14. However, the most important function is to reduce the volume of molten alloy between the surfaces. When the volume of Au-Sn is reduced the overall amount of Sn is correspondingly reduced. Since the temperature is maintained the remaining molten alloy proceeds to interact with the metal of the gettering layer which is conbimed with the alloy. When Au is the gettering layer it combines with the resulting alloy mixture which increases its melting point. When sufficient Au is alloyed in the solution such that its resulting melting point exceeds the heating temperature, the metal freezes. Thus the bond resulting has a significantly higher melting point, preferably above the re-work temperature which is necessary to remove and replace defective devices. In addition the bonding layer is made thinner.

Figure 2:
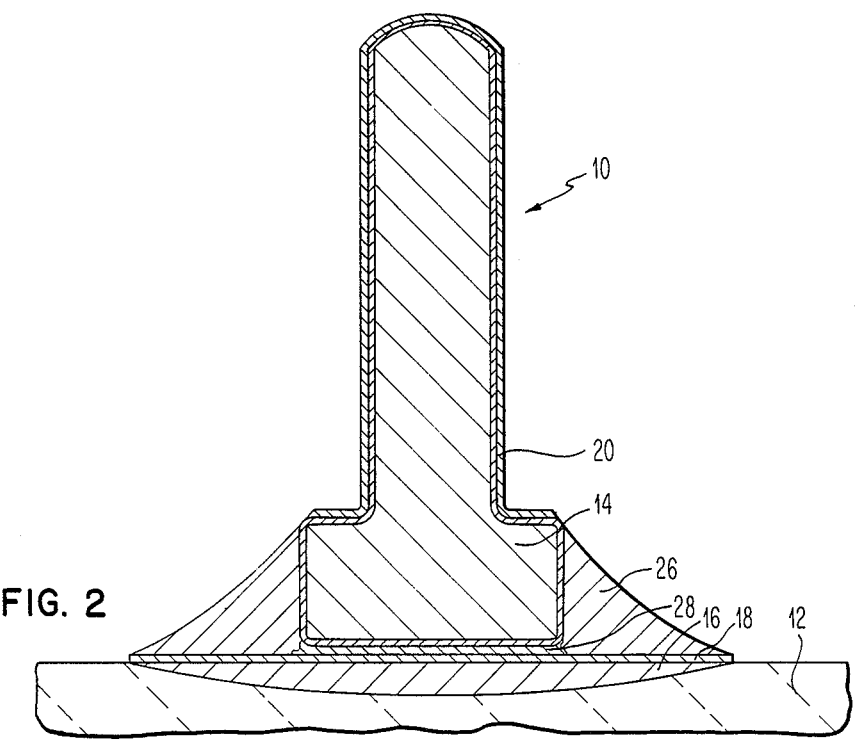
FIG. 2 is a similar fragment of a multi-layer ceramic substrate showing a pin brazed to the substrate.

The resultant bonded pin structure is shown in FIG. 2 where fillet 26 is comprised essentially of the original low melting Au-Sn alloy, but the thin bonding layer 28 has a significantly lower Sn content and a higher melting point. The alloy in fillet 26 has a somewhat higher melting point than the original alloy of preform 24 because it has absorbed the Au layer on the sidewalls of pin head 14 and the peripheral areas of the pad.

Figure 3:
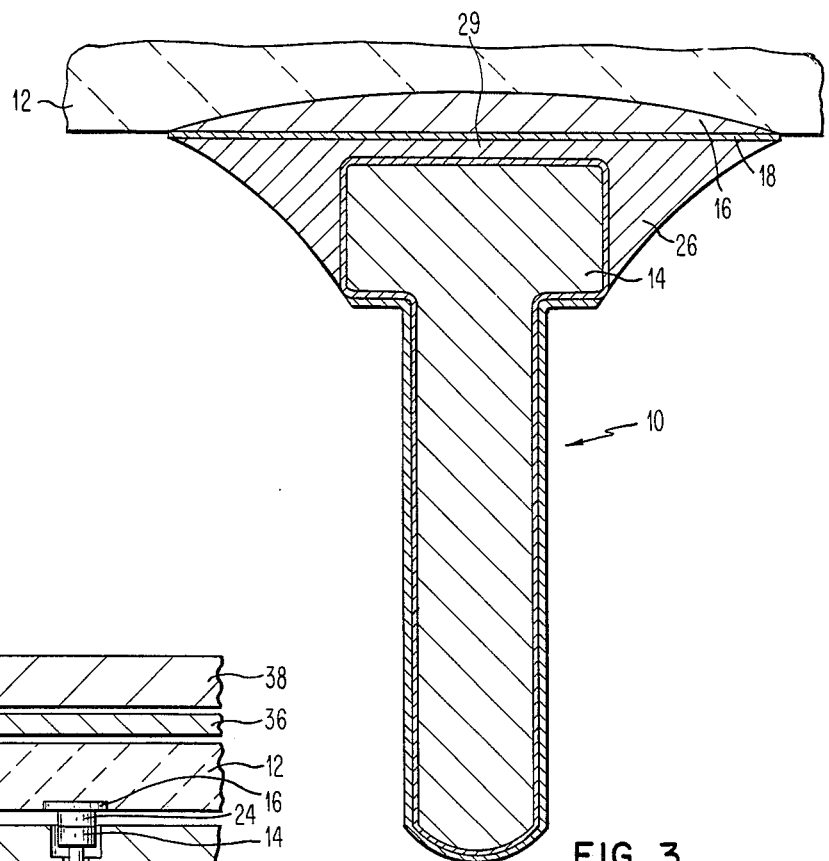
FIG. 3 is a similar fragment of a multi-layer ceramic substrate carrying a pin brazed to the substrate by conventional techniques.

A comparison of FIGS. 2 and 3 illustrate the importance of applying a pressure to force out the molten alloy from between the surfaces being bonded. FIG. 3 shows the cross section structure of the pin when insufficient pressure is applied. As indicated, the bonded surfaces are further apart and the metal layer 29 does not have the required higher melting point necessary to withstand repeated re-working of a substrate.

Figure 4:
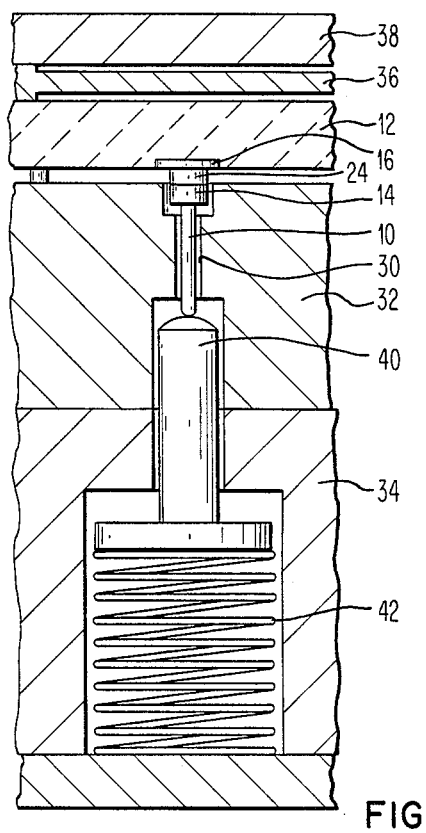
FIG. 4 is an elevational view in broken section of an apparatus used to carry out the method of the invention.

Referring to FIG. 4 there is shown an apparatus suitable for applying the requisite pressure to a pin or other element when bonding by the method of this invention. In use the pins 10 are inserted into apertures 30 in pin nest plate 32, preferably with the assistance of a vibrator mechanism, not shown. The pin nest plate 32 is separated from the underlying spring nest 34 during the bonding operation. Preforms 24 are subsequently placed into the pin nest plate and the substrate 12 located over the pins by suitable locating means, not shown, in an inverted position. A cover plate and a top plate are placed over the substrate 12 and the assembly placed over spring nest 34 with piston pins 40 in abutting relation to pins 10.

The top plate is clamped against the cover plate in substrate 12 so that pins 10 are forced upwardly against the pads 16 on substrate 12. The upward force is provided by piston pin 40 urged upwardly by spring 42.

Figure 5A:
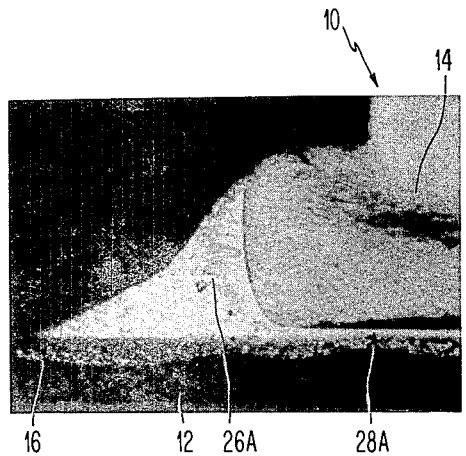
FIGS. 5A and 5B are pictures of sectioned pins mounted on a substrate in magnified scale illustrating the bond produced by the method of the invention at time zero and after 20 reflows.
Figure 5B:
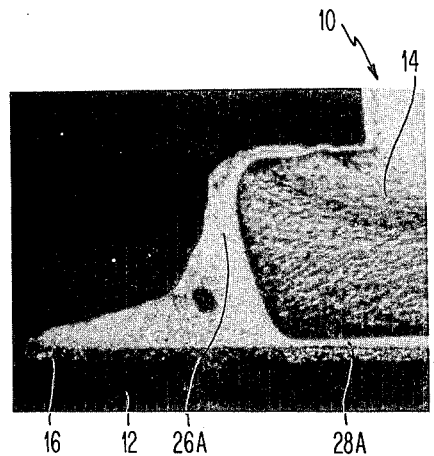
Figure 6A:
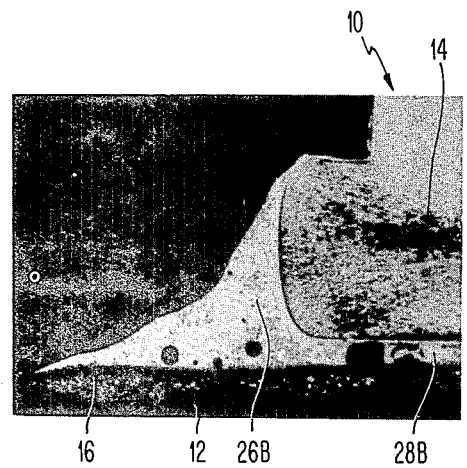
FIGS. 6A and 6B are similar pictures of a pin mounted on a substrate and bonded thereto without the application of pressure, taken at time zero and after 20 reflows.
Figure 6B:
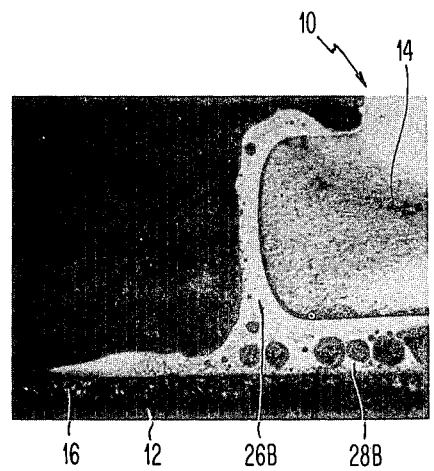

Referring now to FIGS. 5A and 5B there is shown actual cross sections of one half of a pin head bonded to a substrate by the process of the invention. FIG. 5A shows pin head 14 bonded to pad 28A with a relatively thin metal layer as it appears immediately following the bonding operation. FIG. 5B shows a similar actual cross section of a pin after being subjected to 20 re-heating cycles to temperatures of 360° C., comparable to 20 re-work cycles. Note that the bonding layer 28A is substantially the same thickness as the layer in 5A, and that fillet 26 is only slightly changed, and that there are no bubbles in the bonding layer 28A which would reduce bond strength. In comparing the corresponding FIGS. 6A and 6B of pins bonded without the application of pressure during the bonding cycle, it is apparent that a serious degradation has occurred. Note in FIG. 6A that the bonding layer 28B is significantly thicker than 28A of FIG. 5A and that it contains bubbles. Note that in FIG. 6B depicting the same type pin in FIG. 6A after 20 re-heat cycles, that the bonding layer 28B has increased in thickness as compared to 6A and that there is a significant increase in bubbles. This condition indicates a serious degradation in the bond strength. Also note that fillet 26B has moved and has become thinner and higher. This would also degrade the bond strength.

The application to the pins during the bonding operation of this invention results in the formation of the non-melting structure under the pin head, i.e. between the surfaces being bonded. This results in a stable bonding structure which can be processed through many re-heat cycles without fillet degradation. Metallurgically, this is achieved by minimizing the gap between the surfaces and also reacting the low melting Au-Sn bonding material of the preform with the pin plating and the substrate plating to form the higher melting structure. During the bonding process both the gold layers on the pin and on the pad dissolve. The palladium and nickel layers on the pin and pad respectively only partially dissolve, but quantities remain sufficient to maintain the adhesion. The primary alloy formed during the melting stages between the pin and the substrate is the zeta phase of gold-tin (7.5 to 10.3 weight % Sn-balance Au) which has a melting point of 498° C. The fillet is a mix of Au Sn phase and the zeta phase. The objectionable Au Sn phase normally occurring in the bonding area are minimized because the majority of the tin is removed by the tin gettering layer. The objective of this process is to achieve a joint with the maximum zeta phase.

Figure 7:
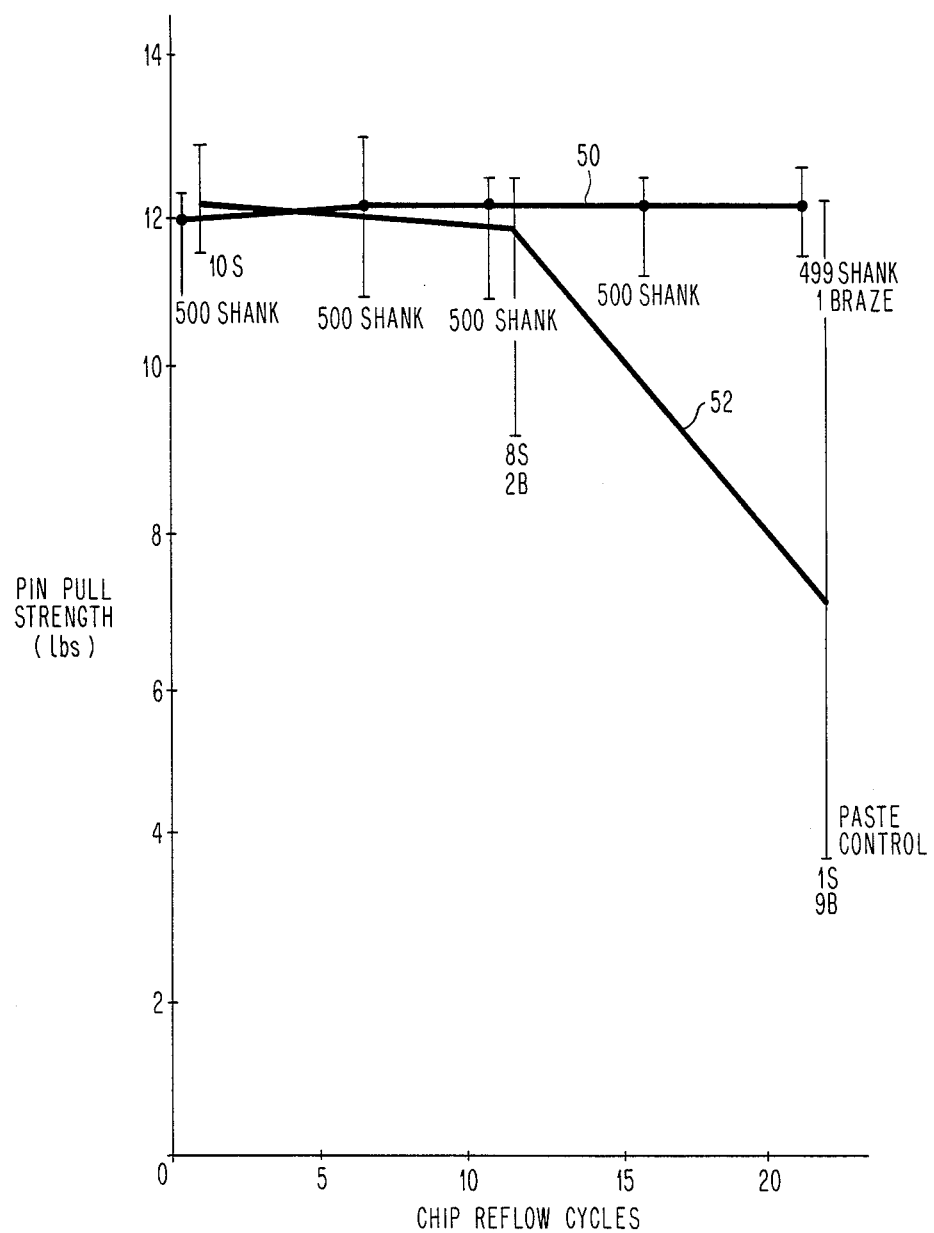
FIG. 7 is a graph of pin pull strength as a function of the number of chip reflow cycles at 350° C. to which the pins are heated subsequent to brazing.

FIG. 7 is a graph of pin pull strength versus chip reflow cycles at 350° C. Curve 50 is plotted from data taken with pins bonded by the method of the invention. Curve 52 is plotted from data taken from similar pins bonded to similar pads with 80 Au 20 Sn alloy but without the application of pressure. In gathering the data, various sets of pins bonded to substrates were subjected to the various numbers of reflow cycles. The force necessary to separate the pin from the substrate was then measured and recorded and plotted on the graph. When the pins broke off at the shank it was so noted. A break at the shank indicated that the bond was stronger than the pin itself. Out of the 2500 pins tested that were bonded by the method of the invention, only one pin bond failed. The remaining 2499 pins broke at the shank. In contrast with the pins bonded without pressure after 20 reflow cycles, 9 pins failed at the braze bond and only one failed at the shank. In general, note that the bond formed by the method of the invention did not materially degrade even after 20 cycles while the bond formed without the application of pressure materially degraded with an increase in reflow cycles.

While the invention has been illustrated and described with reference to preferred embodiments thereof, it is to be understood that the invention is not limited to the precise construction herein disclosed and the right is reserved to all changes and modifications coming within the scope of the invention as defined in the appended claims.

We claim:

1. A method of forming a brazed bond between a flat surface of a I/O pin head and a flat surface of a metallized pad on a ceramic substrate of a semiconductor package comprising the steps of;

providing a Au metal layer on at least one of said flat pin head surface or said flat metallized pad surface, placing the mask of a low melting Au-Sn alloy with a composition of 80% Au±5% with the balance being Sn between said pin head surface and said metallized pad surface, heating the resultant assembly to a temperature in the range of 350° to 450° C., simultaneously with said heating, applying a pressure in the range of 250 to 2500 dynes/cm$^2$ to said surfaces sufficient to squeeze the major portion of the resultant molten Au-Sn alloy from between the surfaces, and cooling the assembly, the bond between said pin head and said metallized pad formed of a relatively higher melting Au-Sn alloy resulting when the major portion of the alloy is removed allowing the major portion of the Sn in the small remaining portion of the alloy to combine with the Au layer to reduce the relative amount of Sn in the brazing bond alloy leaving a higher melting alloy.

2. The method of claim 1 wherein said mass of low melting Au Sn alloy is introduced between said conformal surfaces in the form of a solid preform.

3. The method of claim 1 wherein said mass of low melting Au Sn alloy is introduced between said conformal surfaces in the form of a paste with the alloy being in particulate form.

* * * * *